United States Patent [19]

Fraas

[11] 4,332,974
[45] Jun. 1, 1982

[54] MULTILAYER PHOTOVOLTAIC CELL

[75] Inventor: Lewis M. Fraas, Albany, Calif.

[73] Assignee: Chevron Research Company, San Francisco, Calif.

[21] Appl. No.: 199,803

[22] Filed: Oct. 23, 1980

Related U.S. Application Data

[63] Continuation-in-part of Ser. No. 52,707, Jun. 28, 1979, abandoned.

[51] Int. Cl.³ .............................................. H01L 31/06
[52] U.S. Cl. .................................... 136/249; 136/262; 357/30
[58] Field of Search .......................... 136/249 TJ, 262; 357/12, 30

[56] References Cited

U.S. PATENT DOCUMENTS

| | | | |
|---|---|---|---|
| 4,017,332 | 4/1977 | James | 136/89 |
| 4,128,733 | 12/1978 | Fraas et al. | 136/89 |
| 4,179,702 | 12/1979 | Lamorte | 357/30 |
| 4,227,941 | 10/1980 | Bozler et al. | 136/255 |

OTHER PUBLICATIONS

L. M. Fraas et al., "Design of High Efficiency Monolithic Stacked Multi-Junction Solar Cells", *Conf. Record, 13th IEEE Photovoltaic Specialists Conf.*, (1978), pp. 886-891.

*Primary Examiner*—Aaron Weisstuch
*Attorney, Agent, or Firm*—D. A. Newell; E. J. Keeling; A. Stephen Zavell

[57] ABSTRACT

A new high efficiency, multijunction photovoltaic solar cell for use with a concentrating lens. This cell comprises an elemental single crystal substrate without an internal light sensitive junction, upon which are two or more successive homogenous layers of semiconductor material, each layer containing within it a light sensitive p/n junction of a similar polarity, each layer having essentially the same lattice constant as the single crystal substrate, each layer having a shorting junction contact with the layer immediately above and below it, each successive layer adsorbing light energy at a shorter wavelength, and each layer being of sufficient thickness and appropriate composition to develop essentially the same current as the other layers. The outer surfaces of the top layer and the substrate are provided with electrical contacts for distribution of the electric current. The top contact comprises a layer of a transparent conductive material with electrical connections and the whole structure is completed with an antireflection coating over the top.

10 Claims, 6 Drawing Figures

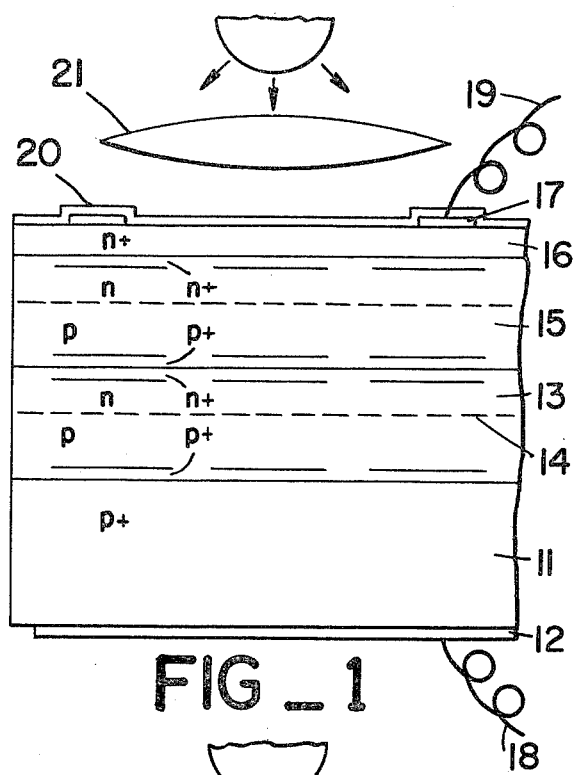
FIG_1
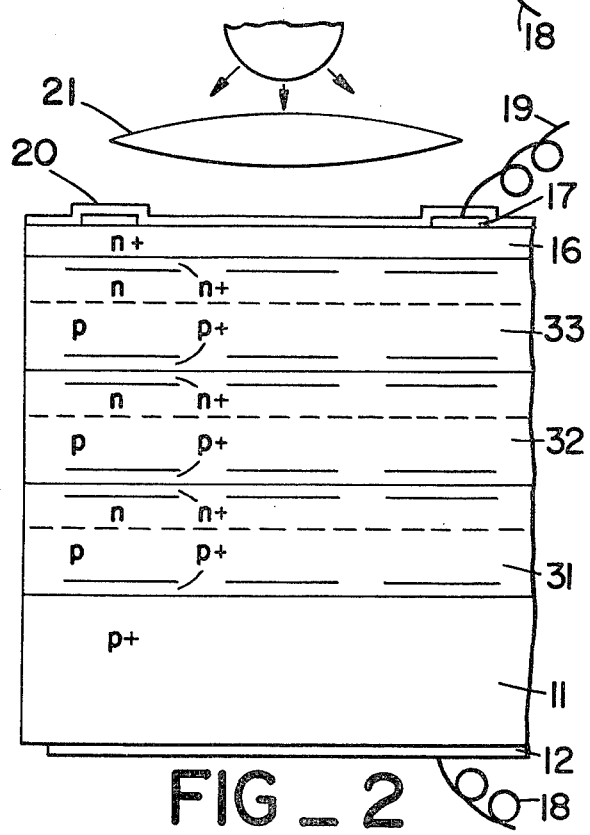
FIG_2

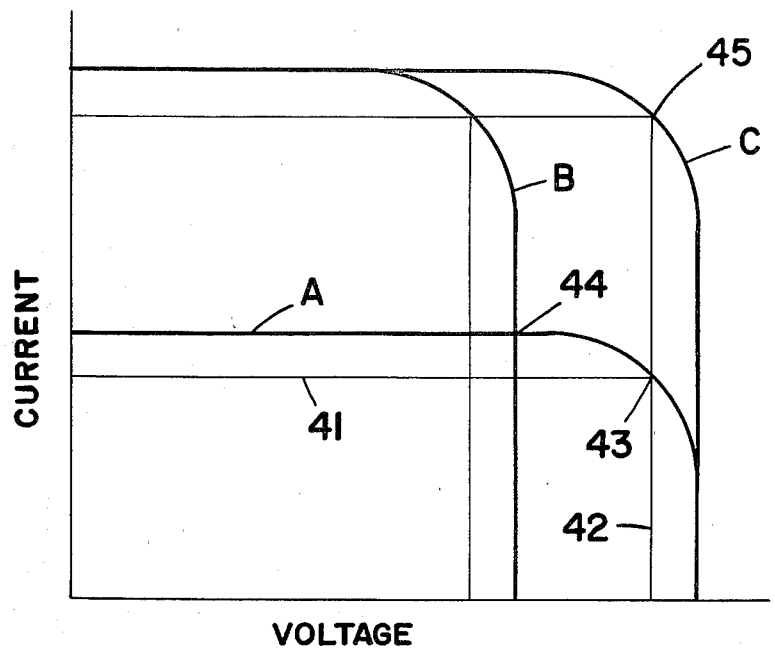
FIG_3
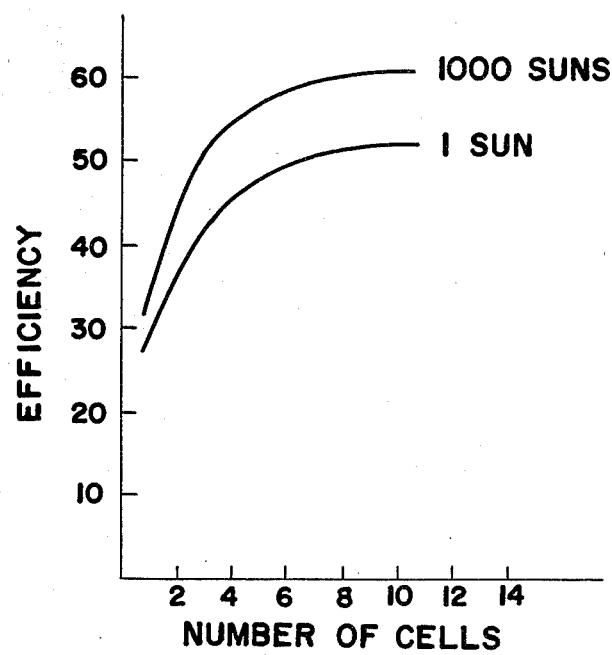
FIG_4

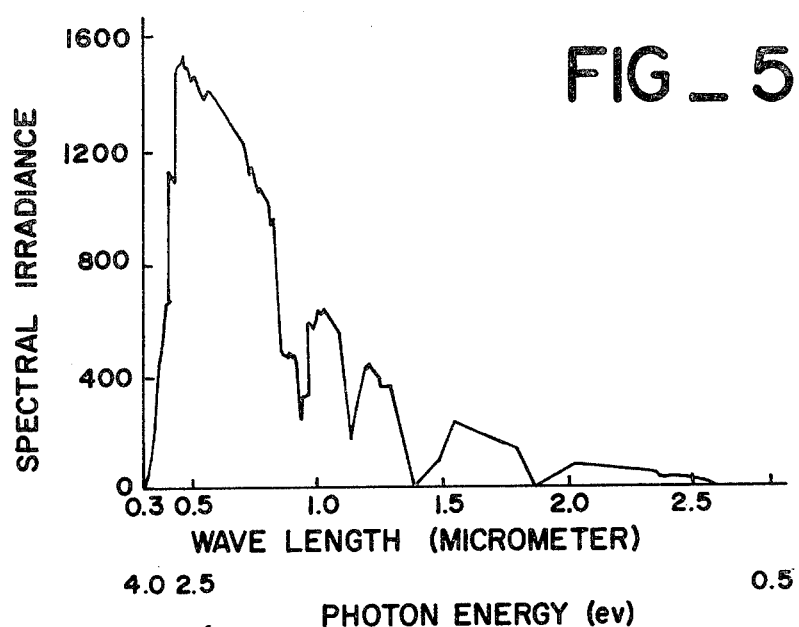
FIG_5
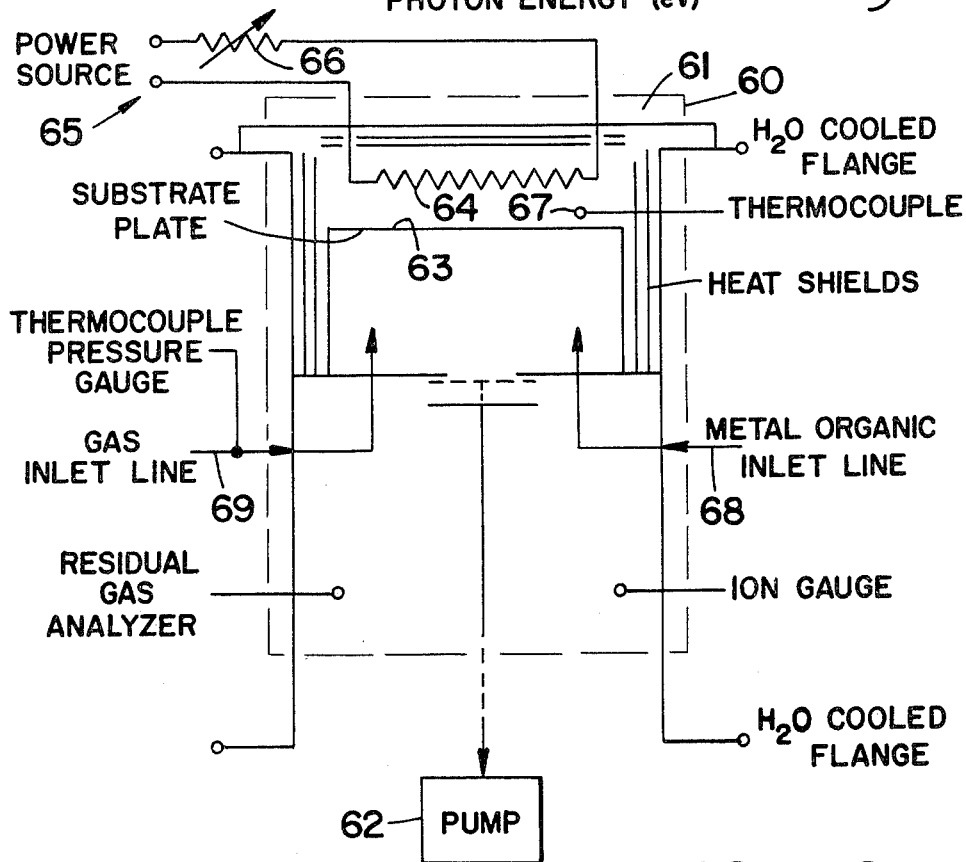
FIG_6

MULTILAYER PHOTOVOLTAIC CELL

This is a continuation-in-part of my application Ser. No. 52,707, filed June 28, 1979, for Multilayer Photovoltaic Cell, abandoned.

FIELD OF THE INVENTION

This invention relates to the conversion of solar energy to electrical energy and particularly to a multilayer photovoltaic cell of high efficiency for such conversion.

BACKGROUND OF THE INVENTION

Several forms of photovoltaic cells have been developed for converting solar energy to electrical energy; however, the efficiency of known systems is low and, when efficiencies are improved through the use of more efficient converters, the cost of the converters is high. It has been proposed to increase the conversion efficiency by concentrating the solar energy, through the use of optical systems, onto the converters. With such systems the efficiency of conversion can be further increased. Cost consideration on each of the several components of a conversion system indicates that, with light concentrators, more expensive photovoltaic converters may be employed, however, there are economic cost limits on the concentrator system. Further, as the concentration of light onto the converter becomes more intense, there is a need for dissipating the heat derived from the concentrated light because the efficiency of some converters drops as the heat of the converter increases.

From a study of the above recited considerations, it can be shown that, with the use of concentrator systems that can decrease the cost of energy conversion by increasing conversion efficiency, the emphasis can shift from converter cell cost to cell efficiency. Thus, if the cell efficiency can be made great enough, a concentrator system can produce electricity more cheaply than the same area of a lower cost array.

These observations lead to the consideration of high efficiency stacked multijunction solar cells with each cell responsive to a different energy band of solar energy and with a concentrator for concentrating the energy and tracking the cell toward the source of energy.

PRIOR ART

Multilayer photovoltaic cells have been suggested as a means for converting solar energy to electrical energy. One form for such a cell is described in U.S. Pat. No. 4,017,332 to L. W. James issued Apr. 12, 1977. This patent suggests a multilayer cell composed of stacks of heterojunction cells. As distinguished from the James disclosure, the present invention is directed to a multilayer photovoltaic cell composed of stacks of homojunction cells.

The prior art multilayer photovoltaic cells have also suggested producing the successive layers of semiconductor materials responsive to different energy bandgaps. See the above mentioned L. W. James Patent. In the cell disclosed herein the several layers are selected to be responsive to different bandgaps all at substantially the same current level with a specific avoidance of the bandgaps for wavelengths of light energy affected by fluctuations in humidity and air mass.

Prior art multilayer photovoltaic cells have been constructed on substrate materials that have been lattice matched to the semiconductor layers of the cell and such substrates have been developed with separate junctions for contributing to the conversion of the overall cell. Again see the L. W. James patent. In the cell disclosed in the present application a relatively inexpensive substrate material is proposed that is specifically lattice matched with the semiconductor layers and specifically designed without an internal junction so as to avoid sensitivity for the cell to the fluctuation in the infrared absorption in the solar spectrum caused by OH vibration bands associated with water vapor. The solar cell proposed herein will therefore be less sensitive to fluctuations in humidity and air mass.

In a prior art publication by the present inventor and R. C. Knechtli at the Thirteenth IEEE Photovoltaic Specialists Conference—1978, June 5-8, 1978, Washington, D.C., a multilayer photovoltaic cell was described having efficiencies of the desired order. The photovoltaic cell disclosed in the present application is distinguished from the prior art disclosure by the specific absence of a junction in the substrate and by the further production of layers lattice matched to the substrate and containing homojunctions to produce the desired electrical conversion with the desired efficiency.

BRIEF STATEMENT OF INVENTION

The idea of obtaining very high energy conversion efficiencies by optically stacking solar cells with different bandgaps is known. There is, however, increasing motivation to consider fabricating such a stack of solar cells monolithically on a single wafer. This follows for space applications because a single wafer is lighter than a multiple wafer stack, and for terrestrial applications using concentrator systems, because a single wafer is likely to be cheaper, simpler, and more easily cooled than is a multiple wafer stack. There are, however, major constraints on the design and fabrication of such a high efficiency monlithic stacked multijunction solar cell. Two design constraints are, first, that the different semiconductor materials making up the stack be nearly lattice matched so that crystal integrity can be maintained, and second, if the light sensitive junctions are to be series connected, that the material bandgaps be such that the light generated current be distributed approximately equally between the multiple junctions. A corollary problem is that of providing the desired series connection of the active junctions without suffering unacceptable voltage losses at inactive junctions, in the stacked structures to be considered.

In accordance with the foregoing, I propose a multijunction photovoltaic cell comprising layers of indium gallium phosphide and indium gallium arsenide on a germanium substrate. The successive layers include junctions in different adsorption bands while the substrate and successive layers are lattice matched to less than ±1% variation. With a concentrator, contacts the cell provides an efficient means for converting solar energy to electrical energy.

OBJECT OF THE INVENTION

The principal object of the invention is to provide an efficient multijunction photovoltaic cell for converting solar energy to electrical energy.

A further object of the invention is to provide a multilayer photovoltaic cell that may be produced from available materials.

Further objects and features of the present invention will be readily apparent to those skilled in the art from the appended drawings and specification illustrated preferred embodiments wherein:

FIG. 1 is a two-junction cell in accordance with the present invention.

FIG. 2 is a three-junction cell in accordance with the present invention.

FIG. 3 is a plot of current vs. voltage for several photovoltaic cells.

FIG. 4 is a plot of solar cell efficiency vs. the number of stacked cells.

FIG. 5 is a plot of the sun's spectral irradiance vs. wavelength and photon energy.

FIG. 6 is a schematic diagram of a growth chamber of fabrication of the photovoltaic cells of the present invention.

DEFINITIONS

Dopant:

A semiconductor can carry current by means of either positively charged or negatively charged carriers. Such carriers are added to the semiconductor via trace chemical impurities called dopants. If the dopants add negative charge carriers to the semiconductor, they are said to dope the semiconductor n-type. If the dopants add positive charge carriers, they are said to dope the semiconductor p-type. When the semiconductor is doped strongly with high concentrations of negative charge such that the semiconductor becomes semimetallic, it is doped n+.

Similarly, high densities of positive charged carriers dope a semiconductor p+. A dopant is distinct from a major chemical component forming the semiconductor in that it is present at $\leq 1\%$ in atomic composition and in that it adds charge carriers to the semiconductor.

Junction:

A junction in a semiconductor device is a planar region on one side of which the carriers are positively charged and on the other side of which the carriers are negatively charged.

Homojunction:

A homojunction is a junction for which the semiconductor material on either side of a junction is the same or homogeneous. In other words, the only chemical difference on either side of the junction is the choice of dopants which are present in trace amounts. The major chemical components forming the semiconductor on either side of the junction are identical.

Heterojunction:

A heterojunction is a junction for which the semiconductor materials on either side of the junction not only differ in carrier type but also in major component compositions. The chemical composition on either side of the junction is heterogeneous. In other words, the semiconductor with positively charged carriers is substantially different chemically from the semiconductor with negatively charged carriers. On occasion, substantial alloying can occur when forming a heterojunction such that the change in carrier type does not occur exactly at the heterogeneous interface. However, herein such a junction is still referred to as a heterojunction.

Bandgap Energy:

A semiconductor absorbs light with photon energies above a certain energy and it transmits light with photon energies less than that energy.

The energy for onset of absorption is called the semiconductor bandgap energy. Changes in semiconductor chemical composition lead to changes in this bandgap energy.

Lattice Match:

The atoms in a crystal are separated by certain spacings and relative angles. The sites on which atoms are found form a crystal lattice. It is possible in some cases to change the atoms in going from one material to another without changing the crystal lattice appreciably. For example, an AlAs crystal has the same crystal lattice as a GaAs crystal. One simply replaces an Al atom with a Ga atom. When two crystals have the same lattice and when the atomic spacings are the same, there is a good lattice match and one crystal can be grown as an extension of the other.

DETAILED DESCRIPTION

FIG. 1 is a schematic cross-sectional representation of a multilayer photovoltaic solar cell of the present invention. The layers of the cell are not to scale either vertically or horizontally except that, in the vertical dimension, the layers are shown in somewhat relative thicknesses. As illustrated, a germanium substrate 11 is provided with a contact surface 12 at one side and is joined to a first semiconductor cell 13 at the other side. The germanium substrate is preferably a single crystal, single element substrate with a crystalline structure that is capable of being lattice matched to a $Ga_{0.88}In_{0.12}As$ semiconductor material responsive in the visible, or near visible, light range. The substrate does not contain a light responsive junction but it is intentionally grown as a germanium crystal because of the lattice structure that permits the match to the first layer of a multilayer cell that is capable of producing light generated current in a range that can be desirably distributed among other layers of a multilayer cell.

The cell 13 is preferably constructed of gallium, indium, and arsenic, having the composition of $Ga_{0.88}In_{0.12}As$ and an energy bandgap of 1.25 ev. A junction 14 is illustrated in the first layer 13. The first cell 13 is lattice matched to the substrate and is capable of absorbing visible, or near visible, light with photon energies above the preferred 1.225 ev. and capable of generating a current compatible with the desired distribution within the multilayer cell.

A second cell 15 is shown in contact with the first cell 13. The cell 15 is preferably constructed of gallium, indium, and phosphorous, having the composition of $Ga_{0.43}In_{0.57}P$ and an energy bandgap of 1.75 ev. The second cell 15 is lattice matched to the first cell and is capable of absorbing visible, or near visible, light with photon energies above the preferred 1.75 ev. and is also capable of generating a current compatible with the desired distribution within the multilayer cell.

Deposited on the other surface of the second cell 15 is a conductive and transparent layer 16 of indium tin oxide or antimony tin oxide. The compositions of indium tin oxide and antimony tin oxide are mixtures of two oxides; indium oxide ($In_2O_3$) and tin oxide ($SnO_2$) in the first composition and antimony oxide ($SbO_2$) and tin oxide in the second. These mixtures may be in any ratio of the two oxides, but in general there is from 80 to 90 mole percent indium oxide in the first composition and from 10 to 30 mole percent antimony oxide in the second composition. These compositions are conventionally indicated by the chemical formulae $In_2O_3/SnO_2$ or $SnO/SbO_2$.

One or more contacts 17 is attached to the outer surface of layer 16. Electrically conductive wires 18 and 19 are attached to the contacts 12 and 17, respectively. A transparent antireflective outer surface coating 20 is applied over the surface layer 16 and contacts 17.

As illustrated in FIG. 1, a concentrator 21, here shown as a concentrating lens, is positioned above the cell in a position to concentrate light from a source 22, here illustrated as the sun.

FIG. 2 illustrates a similar multilayer cell wherein three layers 31, 32 and 33 are assembled between the substrate 11 and the conductive layer 16. The composition of these three layers in the preferred form are:

layer 31, $Ga_{0.88}In_{0.12}As$ with bandgap 1.25 ev.
layer 32, $Ga_{0.69}In_{0.31}As_{0.5}P_{0.5}$ with bandgap 1.50 ev.
layer 33, $In_{0.5}Ga_{0.5}P$ with bandgap 1.85 ev.

In the multilayer cell of FIG. 2, the substrate is preferably single crystal, single element germanium with a lattice structure capable of being lattice matched to $Ga_{0.88}In_{0.12}As$ but does not contain a junction and therefore is not responsive to photons passing to or through it. The lattice structure of the germanium substrate makes it particularly suited to the construction of the three-layer cell of the above composition in that both the desired crystal lattice match may be accomplished throughout the three-layer cell and the desired light generated current will be distributed substantially equally between the multiple junctions permitting series connection of the junctions.

The layers are preferably deposited on the substrate 11 by metal organic chemical vapor deposition processes in a manner to establish a layer of the desired thickness and composition.

The three-junction cell of FIG. 2 has a higher solar energy conversion efficiency than the two-junction cell of FIG. 1 (refer to FIG. 4). A three-layer cell has a theoretical conversion efficiency of 50% at 1000 suns concentration, whereas the two-layer cell has a theoretical efficiency of 44% at 1000 suns.

Although the three-junction cell resembles the cell of FIG. 1, it differs in that the second junction layer 32 and the third junction layer 33 compositions are unobvious. These layers are chosen to contain In, Ga, As and P so that the same metal organic chemical vapor deposition system can be used in a single process sequence to prepare either the device of FIG. 1 or the device of FIG. 2. The compositions are specifically chosen so that lattice matching within 1% is observed for all three layers. Furthermore, the bandgap positions determined by the compositions allow equal currents to be generated in all three layers. This equal current requirement produces the apparently small but very significant compositions shift from $In_{0.57}Ga_{0.43}P$ in layer 15 (FIG. 1) to $In_{0.5}Ga_{0.5}P$ in layer 33 (FIG. 2). A failure to observe this shift would drop the three-layer cell efficiency by approximately 10 percentage points.

The composition of the second layer 32 of FIG. 2, i.e., $Ga_{0.69}In_{0.31}As_{0.5}P_{0.5}$, does not follow by perturbing either layer of FIG. 1 and is therefore unobvious from the cell of FIG. 1. This composition follows from a consideration of bandgap and crystal lattice spacing data for the InGaAsP quarternary metallurgical system as well as a consideration of solar cell current requirements as explained above.

A preferred method for constructing the two- or three-layer cell of my invention is to start with a single crystal substrate, for example, a germanium wafer. The germanium wafer substrate does not include a light sensitive junction by preference; firstly, because a substrate with a junction becomes more costly to construct because the purity of the germanium wafer with a functional light sensitive junction is of the order of $\leq 1$ ppm whereas the wafer without a junction requires purity control of only $\leq 1000$ ppm; and secondly, because a junction in the germanium wafer would be responsive to the light bandgap which is most severely affected by fluctuations in humidity and air mass. A further advantage of the germanium substrate is that it is an elemental semiconductor like silicon and it can be grown as a ribbon, thus contributing to its lower cost. Further, germanium is lattice matched to layers 13 and 15 or 31, 32 and 33 listed above to <1% and should therefore permit the efficiency of the cell, proposed herein, to more nearly approach the theoretical limit.

In the preferred form of the cell described herein, the germanium substrate layer is between 200 and 300 micrometers thick and preferably 250 micrometers. The lower limit on thickness is determined both by operating conditions which establish the conduction characteristics of the substrate and the physical strength of the substrate in its function as the base of the multilayer cell. The upper limit for the dimension of the substrate is mainly economic in that thicker substrates are more costly to make and include more volume of an expensive material.

I propose a growth method which will allow in sequence III-V alloy layer depositions over large substrate areas. This type of deposition is known, having been described in U.S. Pat. No. 4,128,733, issued Dec. 5, 1978 to L. M. Fraas et al. FIG. 6 shows a growth chamber for such a method, called low pressure metal organic chemical vapor deposition (MO-CVD). In this method, one introduces trialkyl gallium or trialkyl indium, or a mixture thereof and phosphine or arsine, or a mixture thereof into a pyrolysis chamber. These compounds react on the germanium substrate to form the required InGaAs on InGaP alloys. One example of the reaction is:

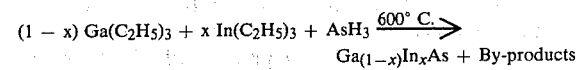

$$(1 - x) Ga(C_2H_5)_3 + x In(C_2H_5)_3 + AsH_3 \xrightarrow{600° C.} Ga_{(1-x)}In_xAs + \text{By-products}$$

wherein x has a value in the range of >0 to 21 1.

The product is a semiconductor film deposited on the germanium substrate.

The semiconductor is doped p-type by adding dialkyl zinc, dialkyl cadmium, or dialkylberylium trimethylamine vapors and n-type by adding hydrogen sulfide, tetralkyl tin or dialkyl telluride vapors. All III-V alloy layers with the prescribed composition are grown in sequence by using a programmable gas flow controller.

In fabricating the cell of FIG. 1, I propose stacking lattice matched homojunction cells together by placing shorting tunnel junctions at the heterofaces. Starting with a germanium substrate with a dopant type p+, the next layer of the cell is formed by the epitaxial deposition of a p+ type layer of gallium indium arsenide preferably with an alloy composition $Ga_{0.88}In_{0.12}As$. During the course of the deposition of this semiconductor layer, the concentration of the dopant is reduced to produce a p-type layer, and eventually the dopant is changed to produce a p/n junction and transition to n-type layer. Continued deposition increases the thickness of the first layer and a finishing portion is deposited with a dopant concentration such as to produce an n+ layer at the boundary of the first layer.

A second semiconductor layer is then epitaxially deposited on the outside surface of the first layer initially with a dopant material and concentration to produce a p+ layer at the interface. The second semiconductor layer is an indium gallium phosphide material with a preferred alloy composition of $In_{0.57}Ga_{0.43}P$. During the course of the deposition of this semiconductor layer, the concentration of the dopant is reduced to produce a p-type layer and eventually the dopant is changed to produce a p/n junction and transition to n-type layer. Continued deposition increases the thickness of the second layer with a transition of dopant composition such as to produce an n+ layer at the boundary of the second layer.

An outer conductive layer is then deposited on the outer surface of the second layer to complete the two-layer photovoltaic cell. The conductive layer may also be an anti-reflective coating. Preferably, the conductive layer has an alloy composition of indium tin oxide ($In_2O_3/SnO_2$), conventionally abbreviated as ITO.

To complete the photovoltaic cell, a pair of conductors are attached one to each outer surface of the substrate and ITO layers.

In fabricating the cell of FIG. 2, the substrate is produced as described with respect to the FIG. 1 cell, then the first layer of lattice matched composition $Ga_{0.88}In_{0.12}As$ is epitaxially deposited, then the second layer of $Ga_{0.69}In_{0.31}As_{0.5}P_{0.5}$, then the third layer of $In_{0.5}Ga_{0.5}P$, and then the outer conductive layer with non-reflective coating. In this three-layer cell, the individual layers are controlled in composition to accomplish the desired lattice match while developing essentially the same zero voltage light generated current to produce a high efficiency, multi-junction photovoltaic solar cell. Each layer contains a light sensitive p/n homojunction and each has a tunneling, shorting heterojunction with the layer immediately above and below it.

It should be noted that the junctions within the photovoltaic cell are homojunctions and that the stacked layers are lattice matched. Further, there are tunnel junctions at the heterofaces between the cells. With this method of construction, more effective tunnel junctions are provided. Since the magnitude of the tunneling currents through a barrier depends on the barrier height as well as the barrier width, placing a tunnel junction at a heteroface provides a barrier height equal to that of the lower bandgap material comprising the heteroface.

In the multilayer photovoltaic cell just described, the first layer has a bandgap of 1.25 ev. and the second layer has a bandgap of 1.75 ev. With the homojunction construction here described, the tunneling barrier height will be 1.25 ev.

In the preferred embodiment here described, the thickness of each deposited semiconductor layer is between 2 and 6 micrometers thick and preferably about 4 micrometers thick. The highly doped tunnel junction layer on the low bandgap side for the homojunction cell must be thin enough not to absorb an appreciable amount of light, i.e., <1000 Å. This criterion is not difficult to meet, since the absorption length is longer just above but near the bandgap of a semiconductor, i.e., the region of interest for a multijunction cell. This layer must also be thick enough not to be completely depleted, i.e., >100 Å.

A form of apparatus for depositing the layers of the photovoltaic cell of the present invention is shown in FIG. 6. The apparatus is shown in schematic diagram form of a pyrolytic chemical vapor deposition system.

The system includes a chamber 61 generally enclosed within the dotted lines 60. The chamber is evacuated by pump 62 to provide a vacuum within the chamber. A substrate support plate 63 is mounted within the chamber in proximity to a heater element 64. Power is supplied to the heater element 64 from source 65 through controller 66. A thermocouple 67 senses the temperature within the chamber 61.

Metal organic materials in gaseous form are supplied through inlet line 68 to the chamber 61. A second inlet line 69 supplies hydride materials in gaseous form to the chamber 61. The various gases react at the temperature and pressure within the chamber to deposit the desired semiconductor alloy composition with the desired type of dopant to produce the epitaxial growth of a lattice matched photovoltaic cell. A chemical vapor deposition process is described in U.S. Pat. No. 4,128,733 and in *Journal of Vacuum Science Technology*, Vol. 15, No. 1, January/February, 1978, pages 119–122.

After the successive layers of the multilayer photovoltaic cell have been deposited, a transparent layer of conductive material is deposited. A preferred form for the transparent conductive layer is indium tin oxide, while other combination materials, such as antimony tin oxide may be deposited with the satisfaction of conditions that the layer be both conductive and transparent to the light energy passing to the active layers of the cell.

The transparent conductive layer of the multilayer cell is preferably between 0.2 and 2.0 micrometers thick with about 1 micrometer thickness being most desirable. The lower limit for the outer conductive layer thickness is determined by its operating characteristics while the upper limit is based on economics of the material and deposition costs.

In a preferred form, a transparent, antireflective outer surface coating 20 is applied over the conductive layer. This antireflective layer reduces the losses due to reflection of the light energy and thus increases the efficiency of the cell. The material for this coating is chosen from compounds such as silicon monoxide, tantalum oxide or titanium oxide.

Each layer of the multilayer cell is lattice matched to its neighbor layer with a maximum lattice constant variation of ±1.0%. This matching is important because with poor lattice matching or nonmatching, crystallinity of the cell system degrades and a structure is formed having a high density of crystal dislocations, and in the worse cases, even grain boundaries. Such dislocations then become sites for recombination of the light generated charge carriers, thus reducing the amount of current produced. These dislocations also provide shunting current paths which further reduce open circuit voltages.

Lattice matching is accomplished by the proper choice of the composition and relative amounts of the materials in the different layers. The method of growth, with special control of the temperature is also important to the formation of high-quality, single crystal layers.

The layers of the preferred multilayer cell deposited on the germanium substrate are all lattice matched to the germanium lattice constant of 5.66 Å to within ±1.0%.

In the FIG. 3 plot of current vs. voltages, the performance of several different photovoltaic cells is illustrated. The curves illustrate at one end the maximum voltage generated at substantially zero current and at the other end the maximum current at substantially zero voltage of "short-circuit" conditions. The preferred operation of a single cell, as cell A, is the maximum power point or the place along the performance curve where the current line 41 and the voltage line 42 intersect as at point 43. In the multilayer cell herein described, the series interconnection requires that the current generated by each separate layer be substantially equal. It follows from this constraint that the optimum design of a multijunction cell with a maximum efficiency will require the cells in the stack to generate substantially the same short circuit currents. FIG. 3 illustrates this point by illustrating performance curves for cells A, B, and C.

In accordance with the foegoing, a multilayer cell involving a cell having the performance curve A and a cell having the performance curve B would be operating in a series additive sense at a current level where the two curves intersect at 44. In the same respect, cells with performance curves B and C would be most efficient at the current level where the curves have the same current as at point 45. In this figure, the multijunction cell composed of cells B and C substantially outperforms a cell composed of cells A and B. [Reference: *Solar Energy*, Vol. 22, pp. 383 (1979)].

FIG. 4 represents the limits of increasing the number of cells of a multilayer cell in an effort to increase the efficiency. In "Thirteenth IEEE Photovoltaic Specialists Conference—1978," page 868 ff. A. Bennett and L. L. Olsen, a calculation method is described indicating a maximum efficiency for 1000 suns of about 60% with 6 active junctions in the multilayer cell.

With the multilayer cell constructed in accordance with the present invention it is predicted that a multilayer structure incorporating two junctions, one at 1.8 ev. in InGaP and one at 1.2 ev. in GaInAs, will have a theoretical efficiency of about 40% and, because the Ge, GaInAs and InGaP layers are lattice matched to <1%, the practical efficiency can be expected to approach the theoretical limit.

FIG. 5 is a plot of spectral irradiance of the sun vs. wavelength and photon energy, illustrating the solar spectral range including wavelengths from the visible range to the infrared range. In the photovoltaic cell of the present invention, it is preferred to operate the individual cells in the wavelengths where the maximum energy is available from the sunlight spectrum. The sun's spectrum of wavelengths ranges from about 0.3 to about 2.5 micrometers with a maximum at about 0.45 micrometers. The photon energy of sun light ranges from 4.0 to 0.65 ev., with a maximum energy at 2.5 ev. The plot of FIG. 5 is for air mass of 1 representing spectral irradiance with the sun directly overhead.

The elements employed in the various layers of FIGS. 1 and 2 are all found in Columns IIIA and VA of the Periodic Table and are preferred for use according to the invention. However, other semiconductive marterials can be used in accordance with the invention as defined by the appended claims and their legal equivalents. For example, compounds formed of elements in Columns IIB and VIA such as CdS and CdTe could be used; also IB-IIIA-VIA compounds such as CuInS or variations thereof where, i.e., Se is substituted for S or Ga for In; also IIB-IVA-VA compounds such as ZnSnP. Also, other IIIA-VA compounds can be used in lieu of the most-preferred IIIA-VA compounds previously discussed.

While certain preferred embodiments of the invention have been specifically disclosed, it should be understood that the invention is not limited thereto as many variations will be readily apparent to those skilled in the art and the invention is to be given its broadest possible interpretation within the terms of the following claims.

What is claimed is:

1. A high efficiency, multijunction photovoltaic solar cell for use with a light concentrating element comprising:
   (a) a single crystal, single element substrate without an internal light sensitive junction, said substrate capable of lattice matching to within ±1% to a $Ga_{0.88}In_{0.12}As$ semiconductor material responsive in the sun light range,
   (b) a first homogeneous layer of semiconductor material deposited on said substrate, lattice matched thereto and having about $Ga_{0.88}In_{0.12}As$ composition with a semiconductor bandgap of 1.25 ev., and absorbing sun light energy at a first wavelength,
   (c) a second homogeneous layer of semiconductor material deposited on said first layer lattice matched to said first homogeneous layer and having about $Ga_{0.69}In_{0.31}As_{0.5}P_{0.5}$ composition with a semiconductor bandgap of 1.5 ev., and absorbing sun light energy at a second wavelength,
   (d) a third homogeneous layer of semiconductor material deposited on said second layer lattice matched to said second homogeneous layer and having about $In_{0.5}Ga_{0.5}P$ composition with a semiconductor bandgap of 1.85 ev., and absorbing visible light energy at a third wavelength,
   (e) said first, second and third layer each having essentially the same lattice constant as said single crystal substrate to within ±1%,
   (f) said first, second and third layer each containing a light sensitive p/n homojunction and each layer having a tunneling, shorting heterojunction with the layer immediately above and below it,
   (g) said first, second and third layers each developing essentially the same zero voltage light generated current as the other layers.

2. The photovoltaic solar cell of claim 1 wherein said substrate layer is germanium.

3. The photovoltaic solar cell of claim 1 with the addition of an outer surface layer of indium tin oxide deposited on the last deposited semiconductor layer.

4. The photovoltaic solar cell of claim 3 wherein said outer surface layer is between 0.2 and 2.0 micrometers thick.

5. The photovoltaic solar cell of claim 4 wherein said outer surface layer is about 1 micrometer thick.

6. The photovoltaic solar cell of claim 1 wherein the substrate layer is between 200 and 300 micrometers thick.

7. The photovoltaic solar cell of claim 6 wherein the substrate layer is about 250 micrometers thick.

8. The photovoltaic solar cell of claim 1 wherein each of said deposited semiconductor layers is between 2 and 6 micrometers thick.

9. The photovoltaic solar cell of claim 8 wherein each of said deposited semiconductor layers is about 4 micrometers thick.

10. The photovoltaic solar cell of claim 1 wherein the lattice constant maximum variation from 5.66 Angstroms between layers is ±1.0%.

* * * * *